(12) United States Patent
Perel

(10) Patent No.: US 6,479,828 B2
(45) Date of Patent: Nov. 12, 2002

(54) METHOD AND SYSTEM FOR ICOSABORANE IMPLANTATION

(76) Inventor: Alexander S. Perel, 500 Locust St., Danvers, MA (US) 01923-1261

(*) Notice: Subject to any disclaimer, the term of this patent is extended or adjusted under 35 U.S.C. 154(b) by 92 days.

(21) Appl. No.: 09/738,486

(22) Filed: Dec. 15, 2000

(65) Prior Publication Data
US 2002/0074521 A1 Jun. 20, 2002

(51) Int. Cl.$^7$ .......................... H01J 37/08; H01J 37/317
(52) U.S. Cl. .................... 250/425; 250/424; 250/423 R; 250/429.21
(58) Field of Search ................................ 250/424, 425, 250/423 R, 429, 492.21

(56) References Cited

U.S. PATENT DOCUMENTS 6,013,332 A * 1/2000 Goto et al. .................. 427/530

* cited by examiner

Primary Examiner—Bruce Anderson
Assistant Examiner—Nikita Wells
(74) Attorney, Agent, or Firm—John A. Kastelic

(57) ABSTRACT

A method of implanting ionized icosaborane ($B_{20}H_x$), triantaborane ($B_{30}H_x$), and sarantaborane ($B_{40}H_x$) into a workpiece is provided, comprising the steps of (i) vaporizing and ionizing decaborane in an ion source (50) to create a plasma; (ii) extracting ionized icosaborane, triantaborane, and sarantaborane (collectively "higher order boranes") within the plasma through a source aperture (126) to form an ion beam; (iii) mass analyzing the ion beam with a mass analysis magnet (127) to permit ionized icosaborane ($B_{20}H_x^+$) or one of the other higher order boranes to pass therethrough; and (iv) implanting the ionized icosaborane ($B_{20}H_x^+$) or one of the other higher order boranes into a workpiece. The step of vaporizing and ionizing the decaborane comprises the substeps of (i) vaporizing decaborane in a vaporizer (51) and (ii) ionizing the vaporized decaborane in an ionizer (53).

10 Claims, 4 Drawing Sheets

METHOD AND SYSTEM FOR ICOSABORANE IMPLANTATION

RELATED PATENT AND PATENT APPLICATION

The following U.S. Patent and patent application, commonly assigned to the assignee of the present invention, are incorporated by reference herein as if they had been fully set forth: U.S. Pat. No. 6,107,634 to Horsky entitled DECABORANE VAPORIZER, and U.S. patent application Ser. No. 09/416,159 filed Oct. 11, 1999, now U.S. Pat. No. 6,288,403 B1, entitled DECABORANE ION SOURCE.

FIELD OF THE INVENTION

The present invention relates generally to semiconductor implantation and more specifically to a method and system for implanting icosaborane, triantaborane, and sarantaborane ions into semiconductors.

BACKGROUND OF THE INVENTION

Conventional ion implantation systems, used for doping workpieces such as semiconductors, include an ion source that ionizes a desired dopant element which is then accelerated to form an ion beam of prescribed energy. The ion beam is directed at the surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in a high-vacuum process chamber which prevents dispersion of the ion beam by collisions with residual gas molecules and which minimizes the risk of contamination of the workpiece by airborne particulates.

Ion dose and energy are the two most important variables used to define an implant step for a particular species. Ion dose relates to the concentration of implanted ions for a given semiconductor material. Typically, high current implanters (generally greater than 10 milliamps (mA) ion beam current) are used for high dose implants, while medium current implanters (generally capable up to about 1 mA beam current) are used for lower dose applications.

Ion energy is used to control junction depth in semiconductor devices. The energy of the ions that make up the ion beam determines the degree of depth of the implanted ions. High energy processes such as those used to form retrograde wells in semiconductor devices require implants of up to a few million electron-volts (MeV), while shallow junctions may only demand energies below 1 thousand electron-volts (keV), and ultra-shallow junctions may require energies as low as 250 electron-volts (eV).

The continuing trend to smaller and smaller semiconductor devices requires implanters with ion sources that continue to deliver higher beam currents at lower energies. The higher beam current provides the necessary dosage levels, while the lower energy levels permit shallow implants. Source/drain junctions in complementary metal-oxide-semiconductor (CMOS) devices, for example, require such high current, low energy applications.

Conventional ion sources utilize an ionizable dopant gas that is obtained either directly from a source of a compressed gas or indirectly from a vaporized solid. Typical source elements are boron (B), phosphorous (P), gallium (Ga), indium (In), antimony (Sb), and arsenic (As). Most of these source elements are commonly used in both solid and gaseous form, except boron, which is almost exclusively provided in gaseous form, e.g., as boron trifluoride ($BF_3$), or as a compound in solid (powder) form as decaborane ($B_{10}H_{14}$).

Decaborane ($B_{10}H_{14}$) could be an excellent source of feed material for boron implants because each decaborane molecule ($B_{10}H_{14}$) when vaporized and ionized can provide a molecular ion comprised of ten boron atoms. Such a source is especially suitable for high dose/low energy implant processes used to create shallow junctions, because a molecular decaborane ion beam can implant ten times the boron dose per unit of current as can a monatomic boron ion beam. In addition, because the decaborane molecule breaks up into ten individual boron atoms of roughly one-tenth the original beam energy at the workpiece surface, the beam can be transported at ten times the energy of a dose-equivalent monatomic boron ion beam. (The individual boron atoms of a singly charged decaborane molecule ($B_{10}H_x^+$) of 10 identical boron atoms accelerated with a voltage V each have an energy of eV/10, and thus the ion beam can be extracted at 10 times the required energy). This feature enables the molecular ion beam to avoid the transmission losses that are typically brought about by low-energy ion beam transport.

Recent process and ion source improvements have enabled the generation of ion beam currents that might prove in the future to be sufficient for production applications of decaborane implants. Keys to such improvements are ion source cooling mechanisms that prevent dissociation of the decaborane molecule and fragmentation of the desired parent molecular ion ($B_{10}H_x^+$) into borane fragments and elemental boron. In addition, in known decaborane ion sources, such as that shown in U.S. Pat. No. 6,107,634, a low-density plasma is maintained to prevent the plasma itself from causing such dissociation and fragmentation.

As stated above, future ultra shallow junctions in semiconductors will likely require boron implants with implant energies as low as 250 eV. At such low energies, ion beam current densities will necessarily decrease. Using even state-of-the art decaborane implant technology, semiconductor implant throughput will decrease unless implant doses can be increased for the same level of ion beam current. In addition, it will be desirable to increase the ion beam energy transport levels without increasing the energy levels of the individual boron atoms implanted. Accordingly, these are objects of the present invention.

SUMMARY OF THE INVENTION

A method of implanting ionized icosaborane ($B_{20}H_x$), triantaborane ($B_{30}H_x$), and sarantaborane ($B_{40}H_x$) into a workpiece is provided, comprising the steps of (i) vaporizing and ionizing decaborane in an ion source (50) to create a plasma; (ii) extracting ionized icosaborane, triantaborane, and sarantaborane (collectively "higher order boranes") within the plasma through a source aperture (126) to form an ion beam; (iii) mass analyzing the ion beam with a mass analysis magnet (127) to permit ionized icosaborane ($B_{20}H_x^+$) or one of the other higher order boranes to pass therethrough; and (iv) implanting the ionized icosaborane ($B_{20}H_x^+$) or one of the other higher order boranes into a workpiece. The step of vaporizing and ionizing the decaborane comprises the substeps of (i) vaporizing decaborane in a vaporizer (51) and (ii) ionizing the vaporized decaborane in an ionizer (53).

DETAILED DESCRIPTION OF A PREFERRED EMBODIMENT OF THE INVENTION

Figure 2:
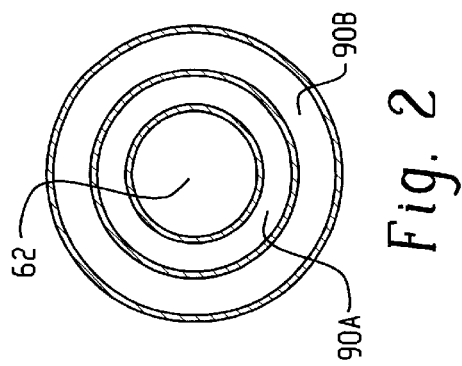
FIG. 2 is a cross sectional view of a connecting tube of an alternative embodiment of the ion source of FIG. 1, taken along the lines 2—2.
Figure 1:
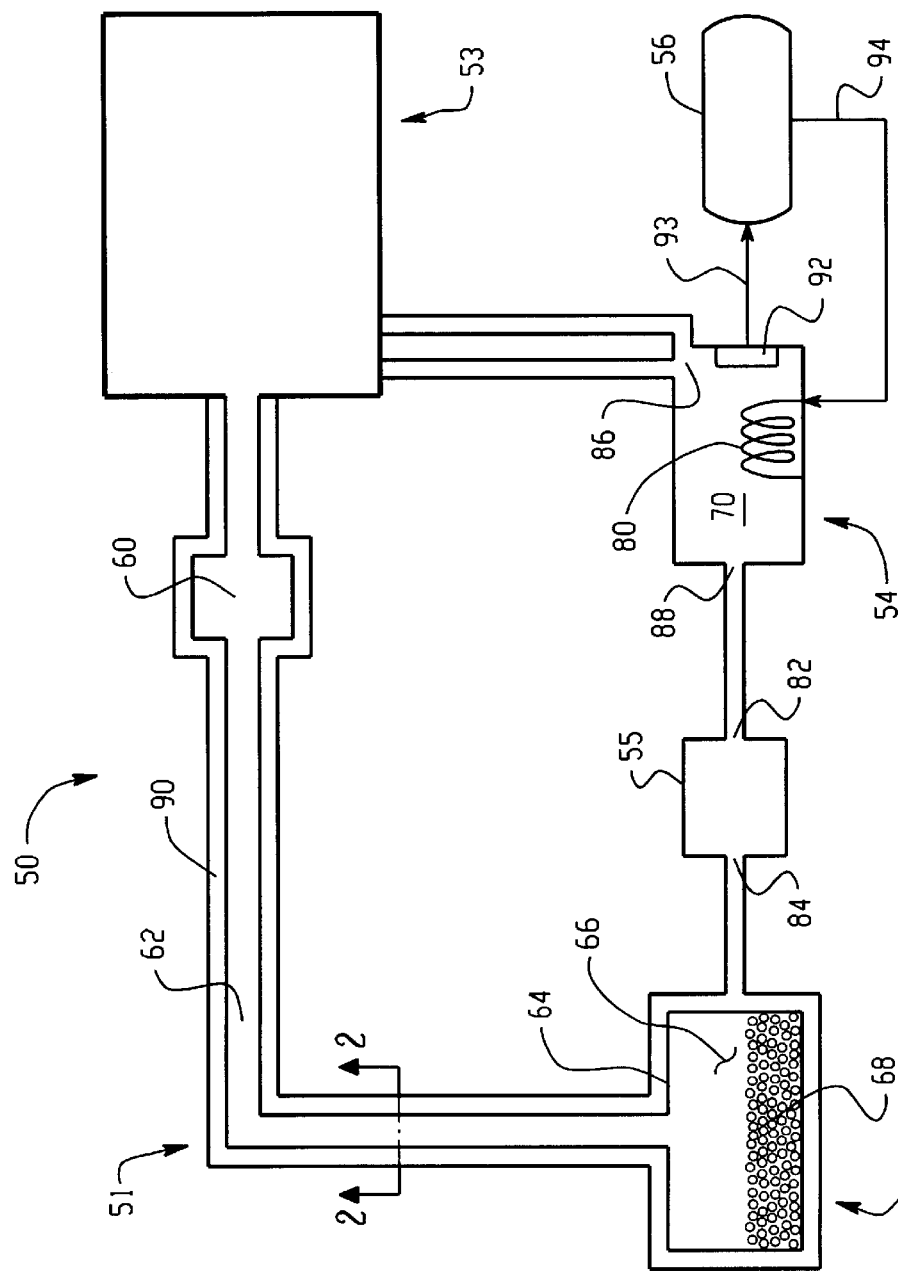
FIG. 1 is a schematic, partially cross sectional view of a first embodiment of an ion source for an ion implanter constructed according to the principles of the present invention.
Figure 3:
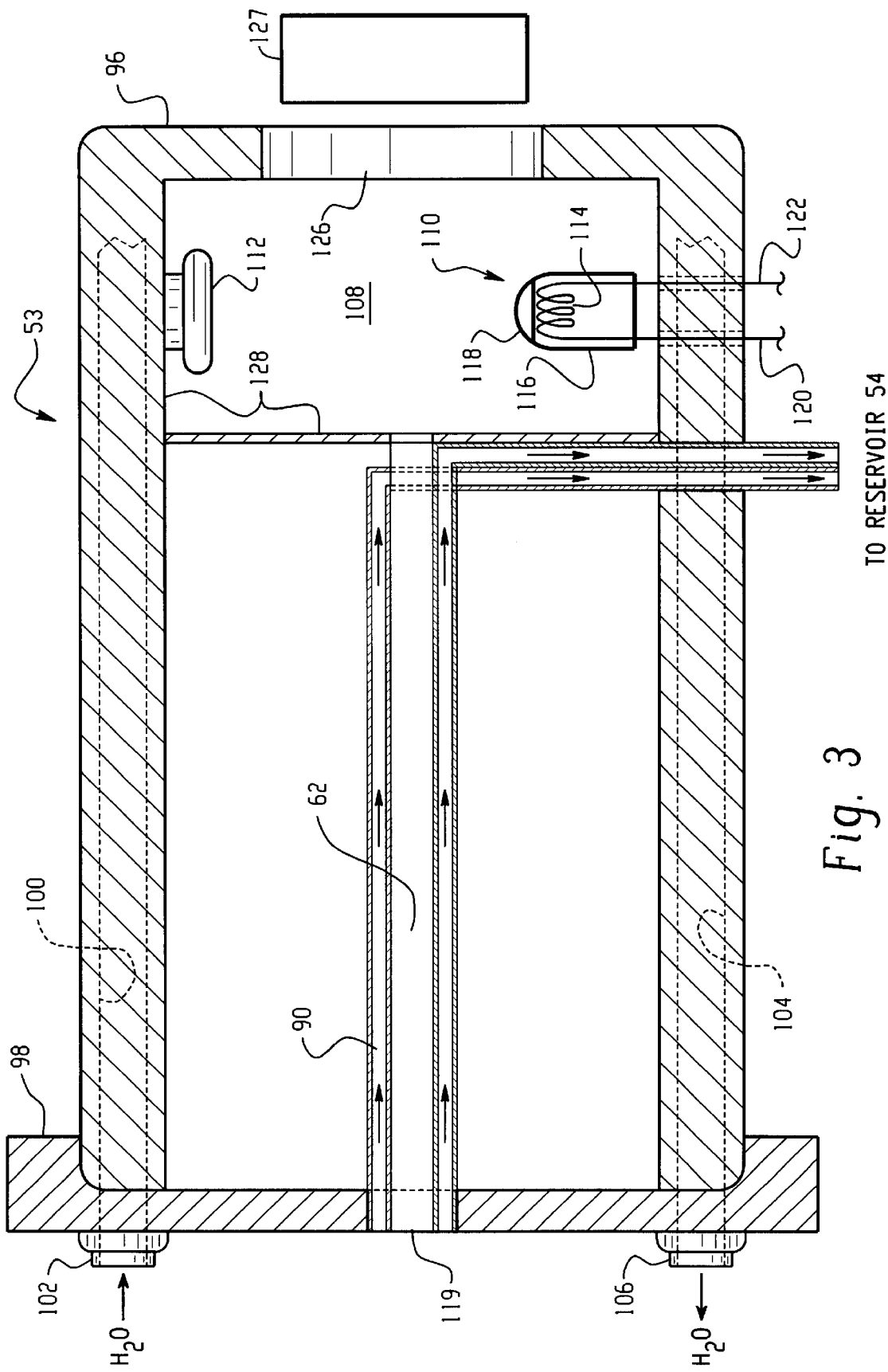
FIG. 3 is a partially cross sectional view of the ionizer portion of the ion source of FIG. 1.

Referring now to FIGS. 1–3 of the drawings, and initially to FIG. 1, an ion source 50 comprising a vaporizer 51 and an ionizer 53 are shown, constructed according to the present invention. The vaporizer 51 comprises a non-reactive, thermally conductive sublimator or crucible 52, a heating medium reservoir 54, a heating medium pump 55, a temperature controller 56, and a mass flow controller 60. Ionizer 53 is shown in more detail in FIG. 3. The crucible 52 is located remotely from the ionizer 53 and connected thereto by a feed tube 62, constructed of quartz or stainless steel. In the disclosed embodiment, the feed tube 62 is surrounded by an outer single-chamber annular sheath 90 along substantially the entire length thereof.

The crucible 52 provides a container 64 enclosing a cavity 66 for containing a source material 68. The container is preferably made of a suitable non-reactive (inert) material such as stainless steel, graphite, quartz or boron nitride and which is capable of holding a sufficient amount of source material such as decaborane ($B_{10}H_{14}$).

The decaborane is vaporized through a process of sublimation by heating the walls of the container 64 with a heating medium 70 contained in reservoir 54. Decaborane is typically available in fine powder form having a vapor pressure of 0.1 torr at room temperature and 19 torr at 100° C. Completely vaporized decaborane exits the crucible 52 via feed tube 62 and enters mass flow controller 60, which controls the flow of vapor, and thus meters the amount of vaporized decaborane which is provided to the ionizer 53.

Alternatively, in a second embodiment of the invention, the feed tube 62 is provided in the form of a capillary tube and sheath 90 is provided in the form of a coaxial dual-chamber sheath, comprising an inner sheath 90A surrounded by an outer sheath 90B (see FIG. 2). The heating medium may be pumped into the inner sheath 90A (located adjacent the capillary tube 62) and pumped out of the outer sheath 90B (located radially outward from the inner sheath 90A). In this second embodiment, the mass flow controller 60 is replaced with a heated shut-off valve (not shown) located at the feed tube/ionizer interface, and mass flow is increased or decreased by directly changing the temperature of the reservoir 54.

The ionizer 53 is shown in more detail in FIG. 3. The ionizer 53 comprises a generally cylindrical body 96 and a generally annular base or mounting flange 98, both in the preferred embodiment constructed of aluminum. The aluminum body 96 is cooled by means of entry cooling passageway 100 fed by inlet 102 and exit cooling passageway 104 which exits body 96 via outlet 106. The cooling medium may be water or any other suitable fluid having high heat capacity. The entry and exit cooling passageways provide a continuous pathway by which water flows therethrough to cool the ionizer body 96. Although only a fragmented portion of the pathway is shown in phantom in FIG. 3, the pathway may extend near and about the outer periphery of the body in any known configuration to insure that the entire body is effectively cooled.

Cooling the body 96 insures that the ionization chamber 108 resides at temperatures that will accommodate decaborane pressure within the ionization chamber that is sufficiently high. It has been found that the ionizer 53 should be maintained at a temperature low enough (less than 350° C. and preferably between 300° C. and 350° C.) to prevent dissociation and fragmentation of the ionized decaborane molecule.

Referring back to FIG. 3, within the confines of the ionizer body 96 are an extension of the feed tube 62, surrounded by annular sheath 90, terminating at ionization chamber 108. Within the ionization chamber reside a hot cathode 110 and an anti-cathode or repeller 112. The hot cathode 110 comprises a heated tungsten filament 114 surrounded by a molybdenum cylinder 116 and capped by tungsten endcap 118. The heated filament 114 is energized via power feedthroughs 120 and 122 that pass through and are electrically insulated from the aluminum body 96. The repeller 112 is also electrically insulated from the body 96, via a thermally conductive electrically insulating material (such as sapphire) which physically couples the repeller to the cooled ionization chamber 108.

In operation, the vaporized decaborane powder is injected into the ionization chamber via feed tube 62 at ionizer inlet 119. When the tungsten filament 114 is energized electrically by application of a potential difference across feedthroughs 120 and 122, the filament emits electrons that accelerate toward and impact endcap 118. When the endcap 118 is sufficiently heated by electron bombardment, it in turn emits electrons into the ionization chamber 108 that strike the vaporized gas molecules to create ions in the chamber.

A low-density ion plasma is thereby created, from which an ion beam is extracted from the chamber through source aperture 126. The plasma includes decaborane ions ($B_{10}H_X^+$), where X is an integer up to 14, icosaborane ions ($B_{20}H_X^+$), where X is an integer up to 28, triantaborane ions ($B_{30}H_X^+$), where X is an integer up to 42, and sarantaborane ions ($B_{40}H_X^+$), where X is an integer up to 56, all of which are implantable into a workpiece. The term "icosaborane" is intended to include both $B_{20}H_X$ molecules and/or a cluster of two decaborane molecules. The term "triantaborane" is intended to include both $B_{30}H_X$ molecules and/or a cluster of three decaborane molecules. The term "sarantaborane" is intended to include both $B_{40}H_X$ molecules and/or a cluster of four decaborane molecules. The extracted ion beam is then mass analyzed by mass analysis magnet 127 to permit only ions having a prescribed charge-to-mass ratio to pass therethrough. The low density of the decaborane/icosaborane plasma in chamber 108 is in part provided by the relatively low arc discharge power maintained in the source (about 5 watts (W) at 50 milliamps (mA)).

Figure 4:
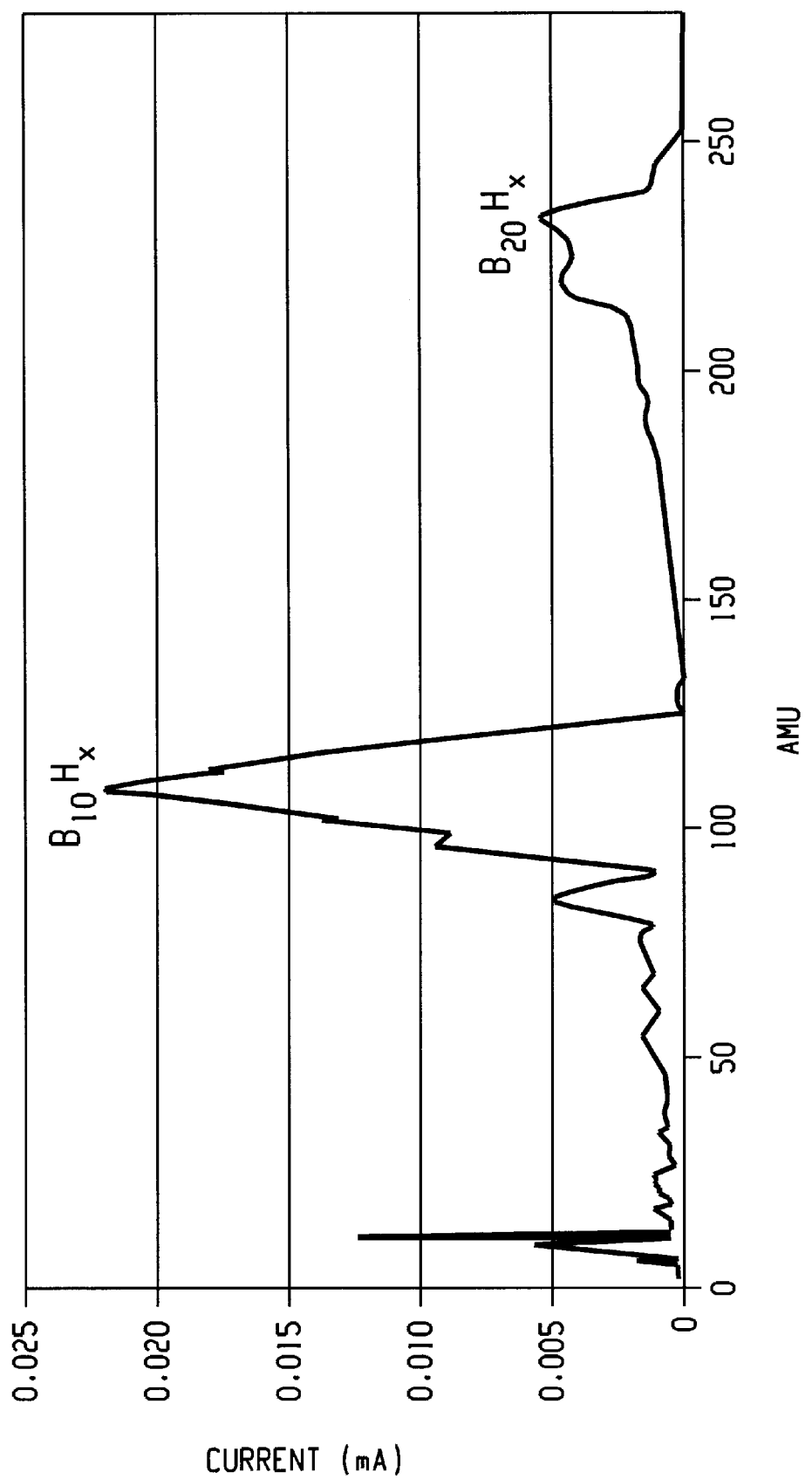
FIGS. 4 and 5, taken together, are a plot of current versus atomic mass unit for an ion beam obtained using the ion source of FIG. 1, showing the presence of icosaborane, triantaborane, and sarantaborane components.
Figure 5:
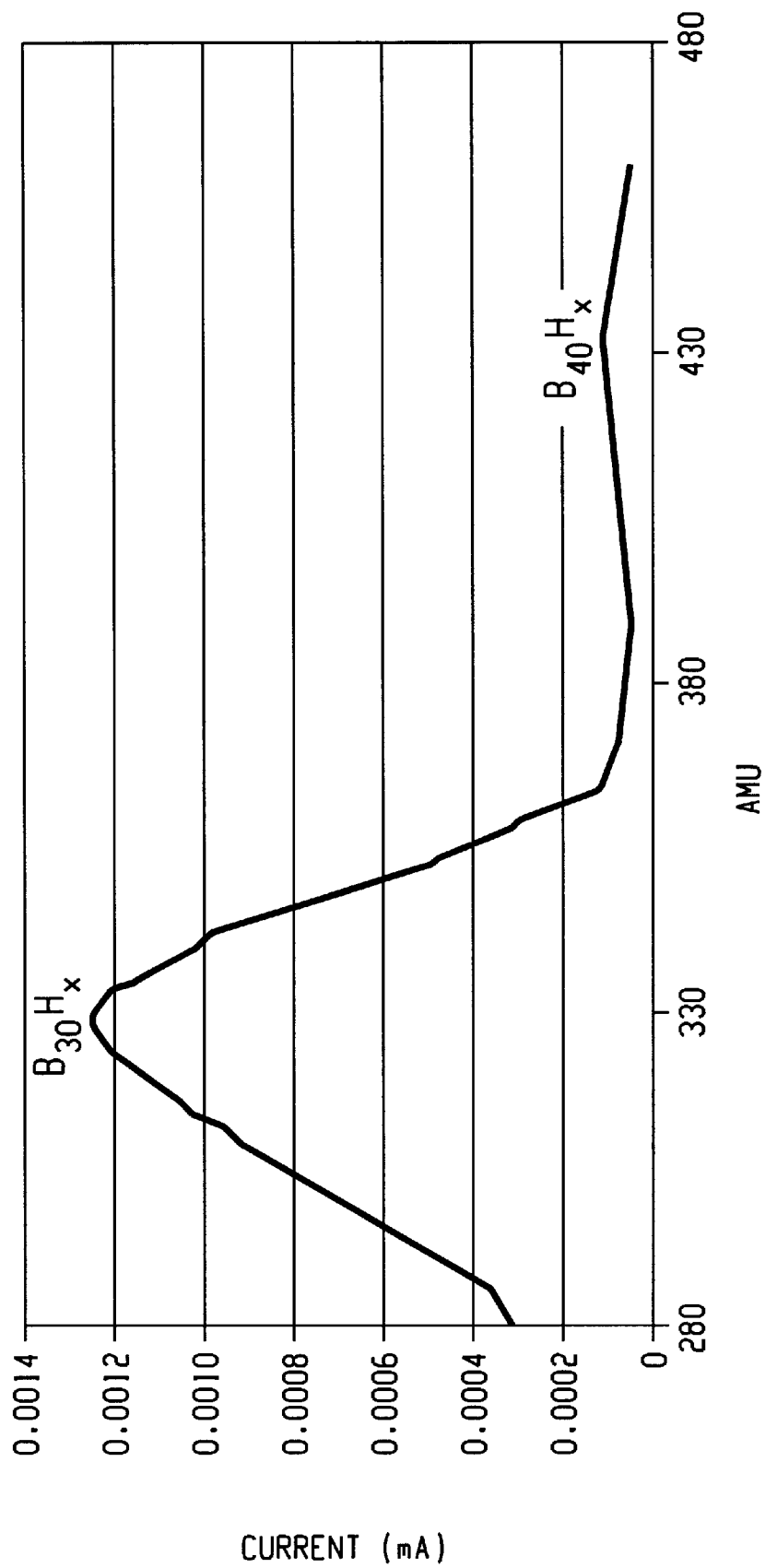

The constituency of the low-density plasma in ionizer 53 is shown in the graphs of FIGS. 4 and 5, which taken together show a plot of current versus atomic mass unit (AMU) for the components of an ion beam obtained using the ion source of FIG. 1. As shown in these Figures, individual definable peaks represent decaborane ($B_{10}H_X$) and icosaborane ($B_{20}H_X$) in FIG. 4, and $B_{30}H_X$ and $B_{40}H_X$ in FIG. 5. In FIG. 4, the decaborane peak is observed at 117 AMU, and the icosaborane peak is observed at 236 AMU. In FIG. 5, the $B_{30}H_X$ peak is observed at approximately 350 AMU and $B_{40}H_X$ peak is observed at roughly 470 AMU.

Using the source 50 of FIG. 1 in an ion implanter, an entire decaborane molecule (ten boron atoms) is implanted into the workpiece. The molecule breaks up at the workpiece surface such that the energy of each boron atom is roughly one-tenth the energy of the ten-boron group of atoms (in the case of $B_{10}H_{14}$). Thus, the beam can be transported at ten times the desired boron implantation energy, enabling very shallow implants without significant beam transmission losses. In addition, at a given beam current, each unit of current delivers ten times the dose to the workpiece. Finally, because the charge per unit dose is one-tenth that of a monatomic beam implant, workpiece charging problems are much less severe for a given dose rate.

With regard to the icosaborane ($B_{20}H_x$) component of the ion beam that is extracted from the ion source through source aperture 126, it is believed that the icosaborane is being formed by the irradiation of decaborane with H or $H_2$ ions within the ionizer 53 of source 50. Under specific source conditions, decaborane vapor in the ionizer 53 results in an adjacent sub-spectrum from mass 130 AMU to 240 AMU (see FIG. 4) that appears to be similar to the decaborane spectrum. Thus, the ion beam extracted through the ion source aperture 126 includes, in addition to the fragmented decaborane spectrum, a fragmented decaborane "dimer" (also referred to herein as a dual cluster of molecular decaborane or icosaborane ($B_{20}H_x$)). Ionized icosaborane ($B_{20}H_x^+$) is implantable at energy per boron atom of below 500 eV, and even as low as 250 eV, at boron particle currents as high as 1.6 millamp (mA).

Using the source 50 of FIG. 1 in an ion implanter, an entire icosaborane ion (twenty boron atoms) is implanted into the workpiece. The ion breaks up at the workpiece surface such that the energy of each boron atom is roughly one-twentieth the energy of the twenty-boron group of atoms (in the case of $B_{20}H_x$). Thus, the beam can be transported at twenty times the desired boron implantation energy, enabling very shallow implants without significant beam transmission losses. In addition, at a given beam current, each unit of current delivers twenty times the dose to the workpiece. Finally, because the charge per unit dose is one-twentieth that of a monatomic beam implant, workpiece charging problems are much less severe for a given dose rate.

The mass analysis magnet 127 can be adjusted, as is known in the art, to permit to pass therethrough only particles having a charge-to-mass ratio within a specific range. Accordingly, the mass analysis magnet 127 may be adjusted to permit either molecular decaborane ($B_{10}H_{14}$) or icosaborane ($B_{20}H_x$) to pass therethrough. Still further, the magnet may be adjusted to permit passage therethrough of either of the other higher order boranes ($B_{30}H_x$ and $B_{40}H_x$) in the ion beam.

Electrons generated by cathode 110 which do not strike a decaborane molecule or one of the higher order boranes in the ionization chamber to create a decaborane or icosaborane ion move toward the repeller 112, which deflects these electrons back toward the cathode. The repeller is preferably constructed of molybdenum and, like the cathode, is electrically insulated from the ionizer body 96. Walls 128 of the ionization chamber 108 are maintained at local electrical ground potential. The cathode 110, including endcap 118, is maintained at a potential of approximately 50 to 150 volts below the potential of the walls 128. The filament 114 is maintained at a voltage approximately between 200 and 600 volts below the potential of the endcap 118. The large voltage difference between the filament 114 and the endcap 118 imparts a high energy to the electrons emitted from the filament to sufficiently heat endcap 118 to terminologically emit electrons into the ionization chamber 108.

The ion source 50 provides a control mechanism for controlling the operating temperature of the crucible 52, as well as that of the feed tube 62 through which vaporized decaborane passes on its way to and through the ionizer 53. The heating medium 70 is heated within the reservoir 54 by a resistive or similar heating element 80 and cooled by a heat exchanger. The temperature control means comprises a temperature controller 56 which obtains as an input temperature feedback from the reservoir 54 via thermocouple 92, and outputs a control signal to heating element 80, as further described below, so that the heating medium 70 in the reservoir is heated to a suitable temperature.

The heating medium 70 comprises mineral oil or other suitable medium (e.g., water) that provides a high heat capacity. The oil is heated to a temperature within the 20° C. to 250° C. range by the heating element 80 and circulated by pump 55 around the crucible 52 and the feed tube 62 through sheath 90. The pump 55 is provided with an inlet and an outlet 82 and 84, respectively, and the reservoir 54 is similarly provided with an inlet 86 and an outlet 88, respectively. The flow pattern of the heating medium about the crucible 52 and the feed tube 62, although shown in a unidirectional clockwise pattern in FIG. 2, may be any pattern that provides reasonable circulation of the medium about the crucible 52 and the feed tube 62.

Referring back to FIG. 1, the crucible cavity 66 is pressurized in order to facilitate material transfer of the vaporized (sublimated) decaborane from the crucible 52 to the ionization chamber 108 through the feed tube 62. As the pressure within cavity 66 is raised, the rate of material transfer correspondingly increases. The ionization chamber operates at a near vacuum (about 1 millitorr), and thus, a pressure gradient exists along the entire length of the feed tube 62, from the crucible 52 to the ionization chamber 108. The pressure of the crucible is typically on the order of 1 torr.

By locating the crucible 52 remotely from the ionization chamber 108, the material within crucible cavity 66 is thermally isolated, thereby providing a thermally stable environment unaffected by the temperature in the ionization chamber. As such, the temperature of the crucible cavity 66, in which the process of decaborane sublimation occurs, may be controlled independently of the operating temperature of the ionization chamber 108 to a high degree of accuracy (within 1° C.). Also, by maintaining a constant temperature of the vaporized decaborane during transport to the ionization chamber via the heated feed tube 62, no condensation or thermal decomposition of the vapor occurs.

The temperature controller 56 controls the temperature of the crucible 52 and the feed tube 62 by controlling the operation of the heating element 80 for the heating medium reservoir 70. Thermocouple 92 senses the temperature of the reservoir 70 and sends temperature feedback signal 93 to the temperature controller 56. The temperature controller responds to this input feedback signal in a known manner by outputting control signal 94 to the reservoir heating element 80. In this manner, a uniform temperature is provided for all surfaces to which the solid phase decaborane and vaporized decaborane are exposed, up to the location of the ionization chamber.

By controlling the circulation of the heating medium in the system (via pump 55) and the temperature of the heating medium (via heating element 80), the ion source 50 can be controlled to an operating temperature of on the order of 20° C. to 250° C. (+/−1° C.). Precise temperature control is more critical at the crucible, as compared to the end of the feed tube nearest the ionization chamber, to control the pressure of the crucible and thus the vapor flow rates out of the crucible.

Because the plasma density using the inventive source is kept low (on the order $10^{10}/cm^3$) to prevent dissociation of the decaborane/icosaborane molecular structure, total extracted ion beam current will be low when using a conventionally-sized source aperture. Assuming a comparable beam current density, the aperture 126 in the ionizer 53 of the present invention is made large enough to insure an adequate ion beam current output. A 1 cm$^2$ (0.22 cm×4.5 cm) aperture permits a beam current density of about 100 microamps per square centimeter ($\mu$A/cm 2) at the workpiece, and up to (less than or equal to) 1 mA/cm$^2$ of extracted beam current from the source. (The actual focused beam current delivered to the workpiece is only a fraction of the total extracted beam current.) Aperture sizes of about 5 cm$^2$ are possible in some implanters, which would yield a $B_{10}H_x^+$ beam current of about 500 $\mu$A at the workpiece. In ultra low energy (ULE) implanters, even larger aperture sizes (up to 13 cm$^2$) are possible.

Accordingly, a preferred embodiment of an improved method and system for implanting decaborane or icosaborane has been described. With the foregoing description in mind, however, it is understood that this description is made only by way of example, that the invention is not limited to the particular embodiments described herein, and that various rearrangements, modifications, and substitutions may be implemented with respect to the foregoing description without departing from the scope of the invention as defined by the following claims and their equivalents.

What is claimed is:

1. A method of implanting ionized higher order boranes into a workpiece, comprising the steps of:
   (i) vaporizing and ionizing decaborane in an ion source (50) to create a plasma;
   (ii) extracting ionized higher order boranes within the plasma through a source aperture (126) to form an ion beam;
   (iii) mass analyzing the ion beam with a mass analysis magnet (127) to permit a selected ionized higher order borane to pass therethrough; and
   (iv) implanting the selected ionized higher order borane into a workpiece.

2. The method of claim 1, wherein said step of vaporizing and ionizing decaborane in an ion source (50) comprises the substeps of (i)(a) vaporizing decaborane in a vaporizer (51) and (i)(b) ionizing the vaporized decaborane in an ionizer (53).

3. The method of claim 2, wherein said higher boranes include icosaborane ($B_{20}H_x$), triantaborane ($B_{30}H_x$), and sarantaborane ($B_{40}H_x$) and wherein the selected ionized higher order borane is ionized icosaborane ($B_{20}H_x^+$).

4. The method of claim 2, wherein said higher boranes include icosaborane ($B_{20}H_x$), triantaborane ($B_{30}H_x$), and sarantaborane ($B_{40}H_x$), and wherein the selected ionized higher order borane is ionized triantaborane ($B_{30}H_x^+$).

5. The method of claim 2, wherein said higher boranes include icosaborane ($B_{20}H_x$), triantaborane ($B_{30}H_x$), and sarantaborane ($B_{40}H_x$), and wherein the selected ionized higher order borane is ionized sarantaborane ($B_{40}H_x^+$).

6. The method of claim 2, wherein said ionizer (53) is provided with an ionization chamber (108), further comprising the step of actively cooling walls (128) of said ionization chamber (108) during the step of ionizing the vaporized decaborane.

7. The method of claim 6, wherein said step of cooling said ionization chamber walls (128) maintains a temperature of said walls below 350° C. to prevent dissociation of vaporized decaborane molecules.

8. The method of claim 7, wherein said temperature of said walls is maintained between 300° C. and 350° C.

9. The method of claim 2, wherein said source aperture (126) is sized to provide a focused ion beam current of between 100–500 microamps ($\mu$A) at a beam current density of <1 milliamp per square centimeter (mA/cm$^2$).

10. The method of claim 9, wherein said plasma has a density within said ionization chamber (108) on the order of $10^{10}/cm^3$.

* * * * *

UNITED STATES PATENT AND TRADEMARK OFFICE
CERTIFICATE OF CORRECTION

PATENT NO.    : 6,479,828 B2
DATED         : November 12, 2002
INVENTOR(S)   : Alexander S. Perel It is certified that error appears in the above-identified patent and that said Letters Patent is hereby corrected as shown below:

<u>Title page,</u>
Item [73], where "Assignee" has not been designated, add:
-- Assignee: Axcelis Technologies, Inc., Beverly, Mass. --

Signed and Sealed this

Fourth Day of November, 2003

JAMES E. ROGAN
*Director of the United States Patent and Trademark Office*